(12) United States Patent
Hunt et al.

(10) Patent No.: US 6,599,405 B2
(45) Date of Patent: Jul. 29, 2003

(54) RECESSED SPUTTER TARGET

(75) Inventors: Thomas J. Hunt, Peekskill, NY (US); Holger J. Koenigsmann, Congers, NY (US); Paul S. Gilman, Suffern, NY (US)

(73) Assignee: Praxair S.T. Technology, Inc., North Haven, CT (US)

( * ) Notice: Subject to any disclaimer, the term of this patent is extended or adjusted under 35 U.S.C. 154(b) by 0 days.

(21) Appl. No.: 09/870,164

(22) Filed: May 30, 2001

(65) Prior Publication Data

US 2002/0185372 A1 Dec. 12, 2002

(51) Int. Cl.[7] .......................... C23C 14/32; B23K 28/00
(52) U.S. Cl. .......................... 204/298.12; 204/298.13; 228/164; 228/165; 228/193; 228/195
(58) Field of Search .................... 204/298.12, 298.13; 228/164, 165, 193, 195

(56) References Cited

U.S. PATENT DOCUMENTS

| | | | | |
|---|---|---|---|---|
| 4,747,926 A | * | 5/1988 | Shimizu et al. | 204/298.19 |
| 5,215,639 A | * | 6/1993 | Boys | 204/192.12 |
| 5,336,386 A | * | 8/1994 | Marx et al. | 204/298.12 |
| 5,397,050 A | * | 3/1995 | Mueller | 228/193 |
| 5,522,535 A | | 6/1996 | Ivanov et al. | 228/122.1 |
| 5,836,506 A | | 11/1998 | Hunt et al. | 228/172 |
| 6,071,389 A | | 6/2000 | Zhang | 204/298.12 |
| 6,073,830 A | * | 6/2000 | Hunt et al. | 228/203 |
| 6,092,427 A | | 7/2000 | Hunt et al. | 73/835 |

* cited by examiner

Primary Examiner—Rodney G. McDonald
(74) Attorney, Agent, or Firm—Iurie A. Schwartz

(57) ABSTRACT

The method manufactures sputter target assemblies. It first includes the step of manufacturing a target insert. The target insert has a yield strength, a diameter, a height, a planar top surface and a conical-shaped rear surface. Then a backing plate is manufactured. The backing plate has a cylindrical recess that corresponds to the diameter of the target insert. The cylindrical recess has a depth less than the height of the target insert and a yield strength less than the yield strength of the target insert. Finally, pressing the target insert into the cylindrical recess of the backing plate bonds the target insert to the backing plate to form a target assembly. The pressed target assembly contains the target insert with the conical-shaped rear surface.

12 Claims, 3 Drawing Sheets

RECESSED SPUTTER TARGET

FIELD OF THE INVENTION

This invention relates to the field of recessed sputter targets and particularly to a method of manufacturing recessed sputter targets.

BACKGROUND OF THE INVENTION

In the field of sputter target manufacture, various means bond the target material to the backing plate. Historically, target manufacturers soldered targets to backing plates. As sputtering temperatures increased and target sizes increased, soldering failed to provide the necessary bond in view of the following disadvantages: 1) low melting temperatures limited chamber operating temperature; 2) the solder's high vapor pressure introduced impurities into the chamber; and 3) low bond strength, particularly at elevated temperatures, resulted in occasional bond failures. Since a debonded target can destroy not only a wafer, but also its supporting electrostatic chuck, it's most important to avoid bond failures. In fact, bond integrity is so important to sputter target manufacturers that Hunt et al., in U.S. Pat. No. 6,092,427, developed a specialized method for preparing and testing bond interface evaluation samples. This method evaluates the strength of bonds between a sputter target and a backing plate. A sample of the material is removed through a first opening formed at one end and a threaded opening formed to split the first opening into two openings. Threading these openings and pulling the threaded openings measures the bond strength.

In view of the above problems, commercial target manufacturers have proposed several solutions for achieving a solid bond. For example, H. Zhang, in U.S. Pat. No. 6,071,389, discloses the use of a titanium interlayer to diffusion bond a cobalt target to an aluminum or copper backing plate. The process deposits the titanium interlayer by electroplating, sputtering, electroless plating or plasma spraying. The deposited titanium bonds to both the cobalt and the backing plate material. This process also relies upon machining grooves into the target and backing plate to further improve bonding.

Hunt et al., in U.S. Pat. Nos. 5,836,506 and 6,073,830 disclose a method for roughening a cylindrical target's back and side surfaces and diffusion bonding the target's back and side surfaces to a backing plate. This method forms a solid state bond and has proven most effective for securing a target to a backing plate. Unfortunately, since the target sputters preferentially from the center, the cylindrical target's yield or use during sputtering is far less than one-hundred percent. The low yields resulting from preferential center region sputtering leave an opportunity for improved target utilization.

SUMMARY OF THE INVENTION

The method manufactures sputter target assemblies. It first includes the step of manufacturing a target insert. The target insert has a yield strength, a diameter, a height, a planar top surface and a conical-shaped rear surface. Then a backing plate is manufactured. The backing plate has a cylindrical recess that corresponds to the diameter of the target insert. The cylindrical recess has a depth less than the height of the target insert and a yield strength less than the yield strength of the target insert. Finally, pressing the target insert into the cylindrical recess of the backing plate bonds the target insert to the backing plate to form a target assembly. The pressed target assembly contains the target insert with the conical-shaped rear surface.

The sputter target assembly includes a cylindrical backing plate. The cylindrical backing plate has a planar front surface and a recess within the front surface. A target insert bonds to the backing plate within the recess of the backing plate. The target insert has a planar front surface and a rear surface. The rear surface has at least about fifty percent of its surface area conical-shaped or tapered. The rear surface bonds to the backing plate to secure the target insert to the backing plate and form the target assembly.

DESCRIPTION OF PREFERRED EMBODIMENT

Figure 1:
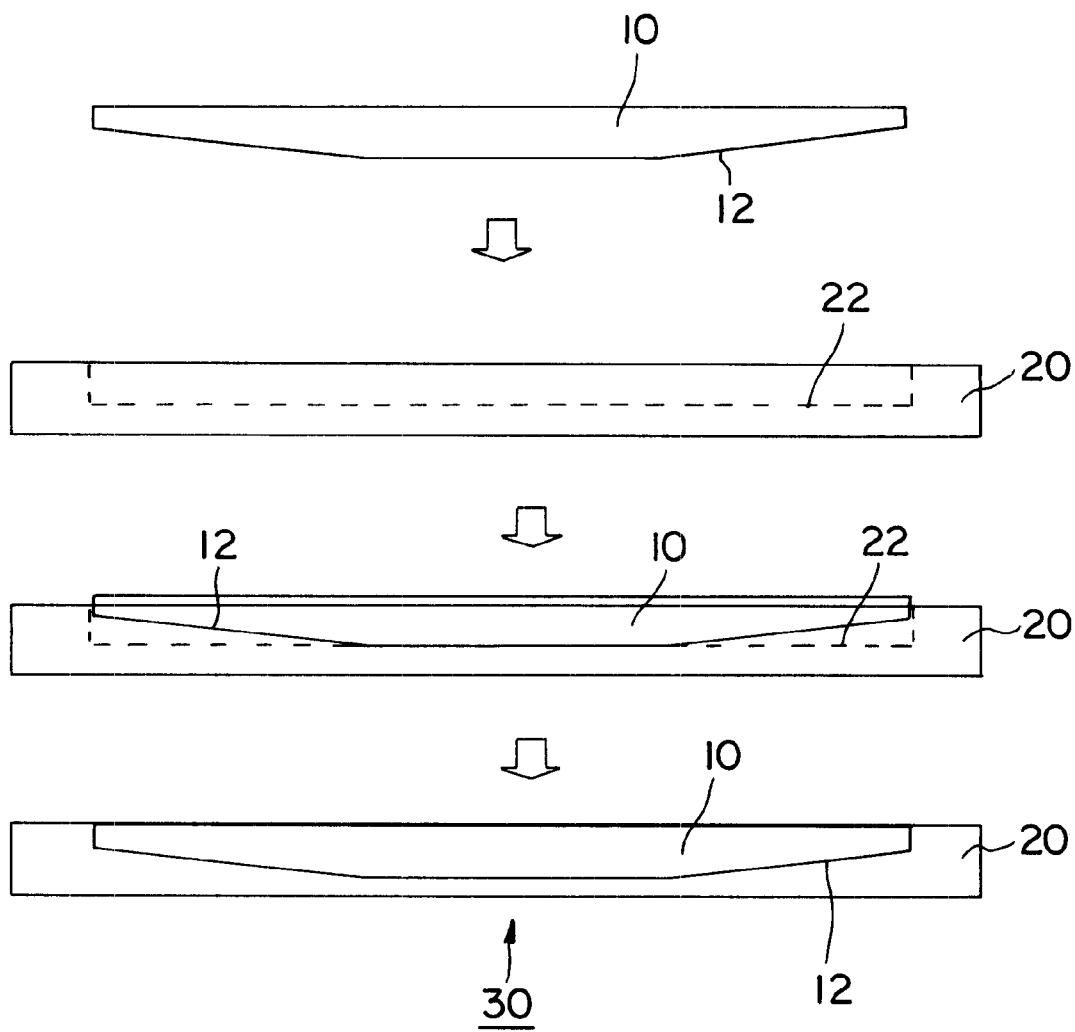
FIG. 1 is a schematic drawing that illustrates the process for pressing the tapered target insert into the backing plate.

The invention provides a method for forming a sputter target assembly with a solid state bond. Referring to FIG. 1, the process relies upon a target insert 10 having a conical-shaped rear surface 12 and a backing plate 20 having a partially mating cylindrical recess 22. Pressing the target insert 10 into the cylindrical recess 22 deforms the backing plate 20 and forms the target/backing plate assembly 30. During this step, the frusta-conical surface 12 maintains its shape and forms the bond. This bond secures the conical or frusta-conical backside 12 of the target insert 10 to the backing plate 20.

The manufacturing method of producing the taper or angled surface 12 may include but is not limited to machining, forging, pressing, casting, hot isostatic pressing (HIP) powder and spinning. Advantageously, the process includes pressing the target insert directly into its conical or partially conical shape to eliminate the material loss experienced by machining. The most suitable method depends upon the target material. Many target materials are suitable for hot pressing or even cold pressing the target into shape. This avoids the machining step and increases yield. High yields are essentially important for high cost target materials, such as high purity tungsten and tantalum. For these materials, pressing the target assembly directly into its insert shape is the most advantageous route for producing the target. For these materials, this represents a clear cost and time savings over machining a tapered target insert to a surface corresponding to a tapered backing plate.

In addition, the use of high purity powders, such as tungsten powders, allows manufacturers to directly compress the powder directly into a target insert of near final shape.

Advantageously, maintaining the target insert and backing plate at a temperature of above 200° C. for at least one hour during pressing improves bonding. Most advantageously, pressing occurs at a temperature of at least 400° C. to further improve bonding between the rear surface of the target insert and the backing plate.

The backing plate 20 contains a cylindrical recess 22 formed by machining the backing plate. Most advantageously, ductile metals or alloys, such as aluminum, copper, aluminum-base alloys or copper-base alloys form the backing plate. Aluminum base alloys, such as alloy 6061 provide the necessary ductility. In addition, the backing plate should have a yield strength less than the yield strength of the target material during pressing. Optionally, the backing plate recess 22 may contain square, tapered or rounded corners. The recess 22 has a volume approximately equal to the volume of the tapered insert 12. This provides sufficient bonding without inducing excessive deformation of the backing plate. Advantageously, the recess 22 has a volume that is at least ninety percent of the volume of the tapered insert 12 to prevent excessive deformation during pressing of the tapered insert 12 into the recess 22. Similarly, the recess 22 advantageously has a volume of less than about one-hundred-twenty percent of the tapered insert 12 to allow good pressing and to prevent the wasting of backing plate material. Most advantageously, the recess 22 has a volume approximately equal to the tapered target insert's volume to limit stresses and maximize bonding.

Pressing the tapered target insert into the recess forms the target assembly. After pressing, the target material retains its original frusta-conical shape. This step relies upon hot pressing, such as vacuum hot pressing or a HIP process to form the final assembly. When the assembly is heated under pressure, the backing plate material reaches a state of plastic deformation that facilitates forming strong solid state bonds. High temperature pressing promotes the reaction of the target material with the backing plate. For some systems, i.e. a titanium target and an aluminum backing plate it is advantageous to diffuse and react the materials together to form reaction products that contribute to the bond strength.

Figure 2:
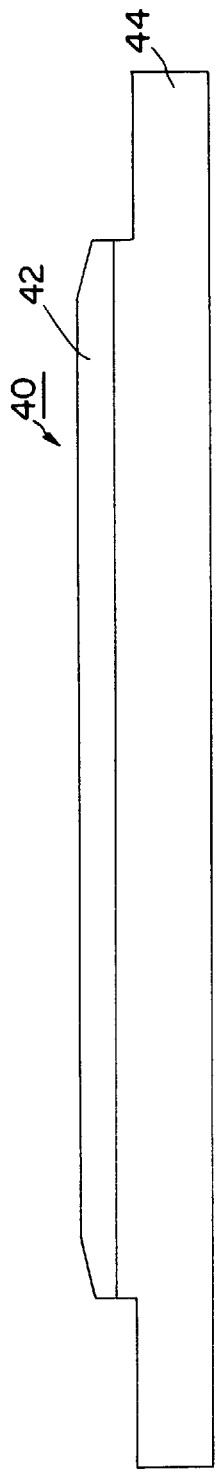
FIG. 2 is a schematic cross section of a standard circular target assembly.
Figure 3B:
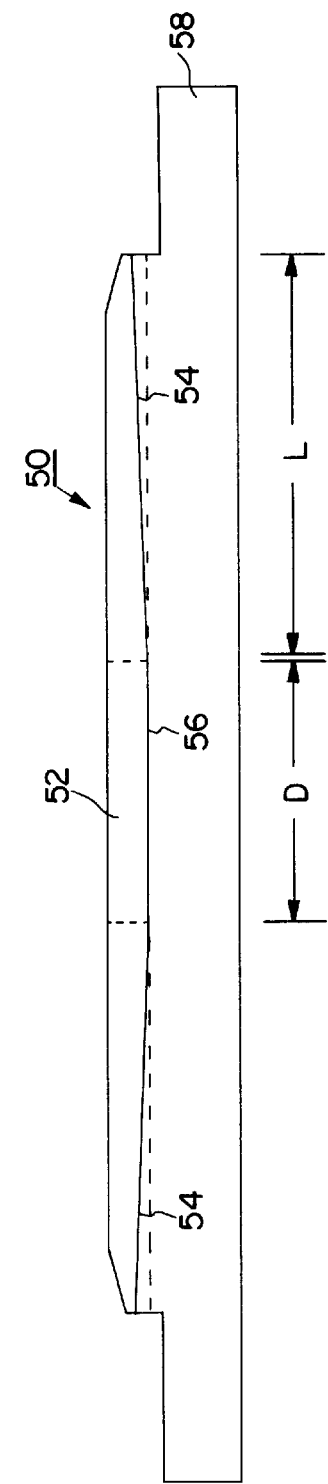
FIG. 3B is a schematic cross section of the target of FIG. 3A taken along line 1—1.
Figure 4:
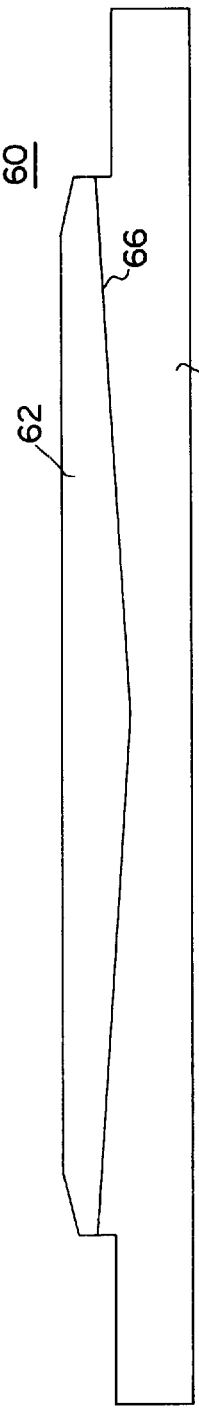
FIG. 4 is a schematic cross section of a circular conical-shaped target embedded in a circular backing plate.

After pressing, the target assembly is ready for finishing operations such as final target machining, polishing, cleaning and machining threaded mounting openings into the backing plate. As illustrated in FIGS. 2 to 4, the final machining process typically removes the backing plate adjacent the target insert's side walls. Sputter chamber specifications determine the amount of backing plate removed from its top surface.

Figure 3A:
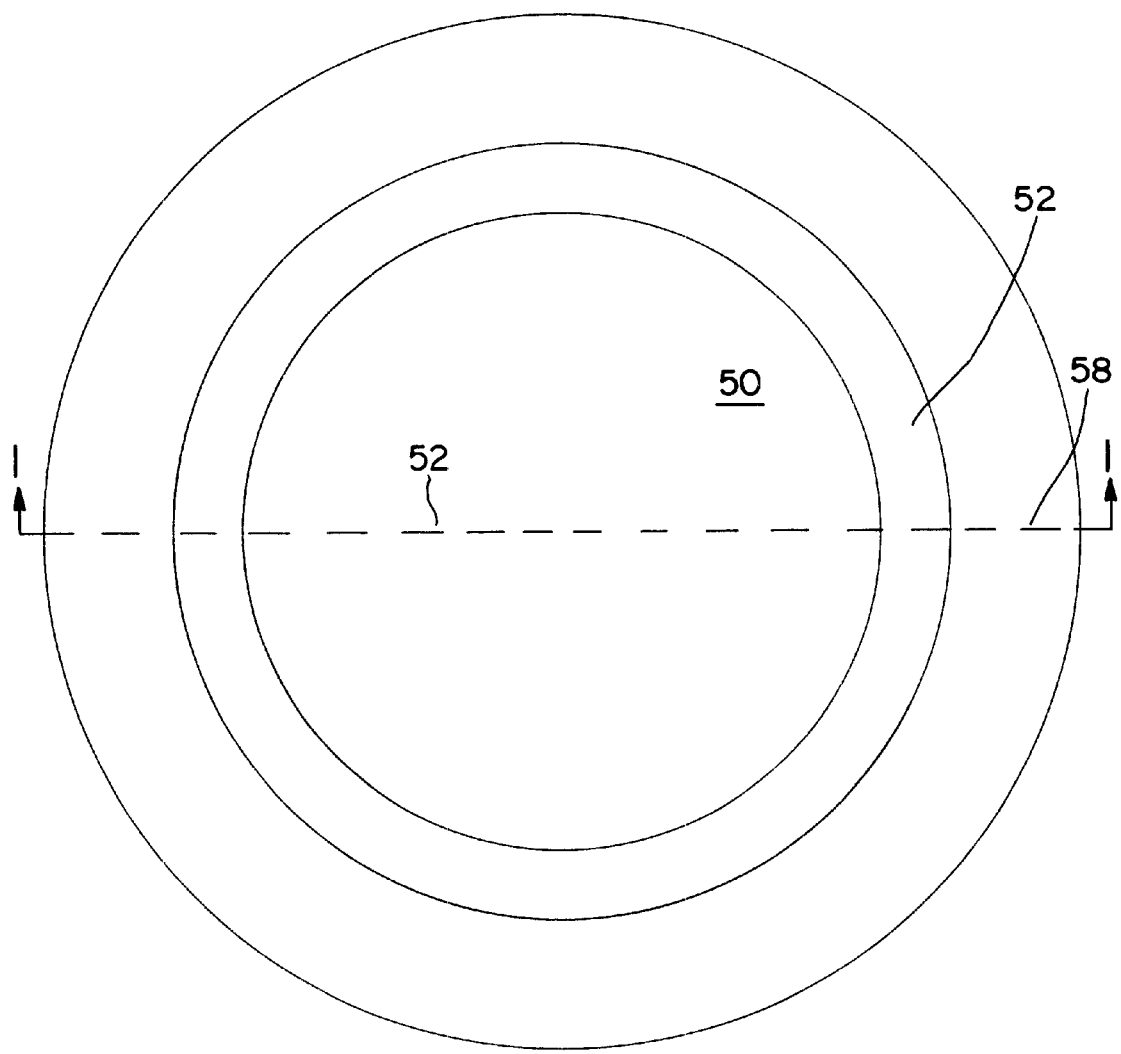
FIG. 3A is a schematic top view of a circular frusta-conical target embedded in a circular backing plate.

FIG. 2 illustrates a standard target assembly 40 formed from a circular target 42 bonded to a circular backing plate 44. Referring to FIGS. 3A and 3B, the target assembly 50 advantageously contains target insert 52 bonded along frustum interface 54 and conical interface 56 to backing plate 58. The frustum interface has a diameter D and the conical interface forms a ring of length L. The length L extends parallel to the conical interface 56. The conical interface 56 consists of at least about fifty percent of the bond surface area between the target insert and the backing plate. Most advantageously, it consists of at least about sixty percent of the total bond surface area of the target insert. The target uses up to approximately about fifteen percent and as high as twenty percent less material to reduce manufacturing cost and achieve the same utilization and settings as a standard target assembly.

FIG. 4 illustrates the optional conical configuration of target assembly 60. In this design, the circular target insert 62 bonds to the circular backing plate 64 along conical bond interface 66. FIG. 4 represents a round target having a top view (not shown) equivalent to FIG. 3A. (The only difference between a top view of FIG. 4 and FIG. 3A would be that it would illustrate items 60, 62 and 64.)

The bond interface of the invention does not lend itself to the use of mating machined grooves, since machined grooves could interfere with the plastic deformation of the backing plate. Advantageously however, a surface treatment step roughens the side and tapered surface of the target insert and the cylindrical recess to form an uneven surface topography to the surface to be bonded. Acceptable surface roughening techniques include, but are not limited to, particle blasting, shot peening and etching. Particles used in particle blasting can be selected from a group that may include but is not limited to: grit, sand, glass beads and steel shot. This process causes a subtle disruption of the associated bonding surface when the components are heated during pressing. Most advantageously, the process uses grit blasting to roughen the target insert to promote the formation of the desirable solid state bonding.

EXAMPLE

A commercial 99.99 percent pure titanium disk having dimensions of 13.572" (34.5 cm) diameter×0.750" (1.9 cm) thickness had a 3° angle machined on the rear bonding surface. The disk's rear bonding surface formed a cone-like shape. The titanium disk was placed in a cylindrical recess machined into a 6061-T6 aluminum disk. The recess contained a volume equal to the volume of the titanium target insert. A HIP process for 2 hours, at 15 ksi (103 MPa), at a temperature of 510° C., bonded the insert to the backing plate. The aluminum disk became plastic during the HIP cycle and conformed to the shape of the tapered titanium target's 3° angle. The plastic deformation that occurred during the HIP process ensured a secure solid state bond. Evaluating this bond by ultrasonic testing, tensile testing and metallographic methods confirmed the bond integrity and strength.

Post HIP ultrasonic testing analysis revealed a one hundred percent bond between the backing plate and the target. In addition, the ultrasonic testing indicated a minor void in the area at the edge of the target.

Metallographic analysis revealed a consistent bond interface with one small void resulting from the square corner of the recessed backing plate not fully extruding or deforming. The location and size of this void would have no impact upon the target's performance. Furthermore, the bottom and side wall bond were equivalent to integral solid state bonding achieved with diffusion bonding techniques. In addition, subsequent testing has shown that a fillet located at the side wall of the recess eliminates any voids.

Two tensile tests in accordance with the two threaded opening sample method confirmed the excellent bond. Both samples, cut across the bond interface, had the aluminum fracture. The first sample fractured at 1,920 lbs. (13.2 MPa). The second sample fractured at 1,830 lbs. (12.6 MPa).

While an example is given for titanium targets, it is noteworthy that this process operates with similar effectiveness on sputter targets of any alloy or composition that is suitable for use as a sputter target such as, aluminum, titanium, copper, chromium, cobalt, nickel and tantalum. In addition, this process operates with the target material and backing plate being either similar or dissimilar alloys. For example, it is possible to place an aluminum-alloy target in an aluminum backing plate or in a copper backing plate.

The tapered target design uses a manufacturing-friendly process to recess the corresponding backing plate and easily adapts to various types of manufacturing equipment. The process also eliminates the need for special-cost-intensive machining of the backing plate blank and reduces the time required for manufacturing. Furthermore, it allows for the manufacture of a sputter target with a decreased thickness at its edges (typically 20–35%). Since this target assembly sputters preferentially from its center, this target requires no change in standard operating conditions. Optionally, the design increases the thickness of the target material without modification of a sputtering system's standard sputter procedure in comparison to a conventional cylindrical target insert. Furthermore, it increases sputter tool productivity by lowering the amount of target material required, thereby reducing cost. Finally, the process also facilitates the forming of strong vacuum compatible bonds. These bonds can have more strength than the actual backing plate itself. Finally, the process reduces the design and manufacturing time required for new designs and products.

Many possible embodiments and sputter target configurations may be made of this invention without departing from the scope thereof, it is understood therefore that all matter set forth herein is to be interpreted as illustrative and not in a limiting sense.

We claim:

1. A method of manufacturing a sputter target assembly comprising the steps of:
   a) pressing a target insert having a near final shape into a backing plate, the target insert having a yield strength, a diameter, a height, a planar top surface and a frusta-conical rear surface;
   b) providing a backing plate, the backing plate having a cylindrical recess corresponding to the diameter of the target insert, the cylindrical recess having a depth less than the height of the target insert and a yield strength less than the yield strength of the target insert; and
   c) hot pressing the target insert into the cylindrical recess of the backing plate to a state of plastic deformation so as to diffusion bond the target insert to the cylindrical recess of the backing plate to form the target assembly, the target assembly containing the target insert with the frusta-conical rear surface.

2. The method of claim 1 wherein at least fifty percent of the frusta-conical rear surface bonds to the backing plate.

3. The method of claim 1 including the additional step of maintaining temperature of the target insert and backing plate above 200° C. for at least one hour to improve bonding between the frusta-conical rear surface of the target insert and the backing plate.

4. The method of claim 1 wherein the pressing of the target into near final shape includes a powder product as the target insert.

5. The method of claim 1 wherein the cylindrical recess has a volume and the target insert has a volume; and the cylindrical recess has a volume equal to or less than the volume of the target insert.

6. The method of claim 1 wherein the cylindrical recess has a volume and the target insert has a volume; and the cylindrical recess has a volume approximately equal to the volume of the target insert.

7. A sputter target assembly comprising:
   a cylindrical backing plate, the cylindrical backing plate having a planar front surface and a recess within the front surface; and
   a target insert bonded to the backing plate within the recess of the backing plate, the target insert having a planar front surface and a rear surface, the rear surface having at least about fifty percent of its surface area conical-shaped and the rear surface being bonded to the backing plate to secure the target insert to the backing plate, wherein the recess is plastically deformed to the shape of the target insert, to form the target assembly.

8. The sputter target of claim 7 wherein a resultant product between the target insert and the backing plate bonds the target insert to the backing plate.

9. The sputter target of claim 7 wherein a conical interface is formed which bonds the target insert to the backing plate.

10. A sputter target assembly comprising:
    a cylindrical backing plate, the cylindrical backing plate having a planar front surface and a recess within the front surface; and
    a target insert bonded to the backing plate within the recess of the backing plate, the target insert having a planar front surface and a frusta-conical shaped rear surface, the rear surface having at least about sixty percent of its surface area conical-shaped and the rear surface being bonded to the backing plate to secure the target insert to the backing plate, wherein the recess is plastically deformed to the shape of the target insert, to form the target assembly.

11. The sputter target of claim 10 wherein a reaction product between the target insert and the backing plate bonds the target insert to the backing plate.

12. The sputter target of claim 10 wherein a frustum interface and a conical interface bond the target insert to the backing plate.

* * * * *